(12) United States Patent
Shibamoto et al.

(10) Patent No.: US 7,615,870 B2
(45) Date of Patent: Nov. 10, 2009

(54) SEMICONDUCTOR DEVICE, MANUFACTURING METHOD THEREOF, AND CONNECTION METHOD OF CIRCUIT BOARD

(75) Inventors: Masanori Shibamoto, Tokyo (JP); Masahiro Yamaguchi, Tokyo (JP); Naoya Kanda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 400 days.

(21) Appl. No.: 11/412,977

(22) Filed: Apr. 28, 2006

(65) Prior Publication Data

US 2006/0244121 A1 Nov. 2, 2006

(30) Foreign Application Priority Data

Apr. 28, 2006 (JP) .............................. 2005-131020

(51) Int. Cl.
*H01L 23/48* (2006.01)
*H01L 23/52* (2006.01)
*H01L 29/40* (2006.01)

(52) U.S. Cl. ................... 257/777; 257/685; 257/687; 257/698; 257/690; 257/723

(58) Field of Classification Search ................ 257/685, 257/687, 690, 698, 723, 777
See application file for complete search history.

(56) References Cited

U.S. PATENT DOCUMENTS 6,239,496 B1 * 5/2001 Asada ........................ 257/777

2004/0251536 A1 * 12/2004 Hatada et al. ............... 257/700
2005/0133897 A1 * 6/2005 Baek et al. .................. 257/686
2006/0249829 A1 * 11/2006 Katagiri et al. ............. 257/686

FOREIGN PATENT DOCUMENTS

| JP | 2002-76240 A | 3/2002 |
|---|---|---|
| JP | 2004-014605 | 1/2004 |
| JP | 2005-101132 | 4/2005 |

OTHER PUBLICATIONS

Japanese Office Action, with a partial English translation, issued in Japanese Patent Application No. 2005-131020, mailed Apr. 7, 2009.

* cited by examiner

*Primary Examiner*—M. Wilczewski
*Assistant Examiner*—Telly D Green
(74) *Attorney, Agent, or Firm*—McDermott Will & Emery LLP

(57) ABSTRACT

Cut pieces of a flexible tape respectively having positioning holes are superposed on a substrate having positioning holes, while positioning the substrate and the cut pieces by inserting a positioning pin into the positioning holes respectively, so that one side of the substrate faces one side of the cut pieces. Subsequently, internal terminals provided on the substrate are ultrasonically joined with internal terminals provided on the cut pieces by pressing an ultrasonic tool from the other side of the cut pieces. As a result, connection between these can be performed highly accurately. Further, since the internal terminals are ultrasonically joined with each other, operation time does not increase in proportion to the number of terminals, as in the connection using a bonding wire, and misregistration due to heat does not occur. Accordingly, connections between circuit boards are performed efficiently, highly accurately, and reliably.

12 Claims, 13 Drawing Sheets

SEMICONDUCTOR DEVICE, MANUFACTURING METHOD THEREOF, AND CONNECTION METHOD OF CIRCUIT BOARD

TECHNICAL FIELD

The present invention relates to a semiconductor device and a manufacturing method thereof, and more specifically, relates to the semiconductor device including a plurality of circuit boards such as interposers, and the manufacturing method thereof. The present invention also relates to a connection method of the circuit boards, and more specifically, relates to a method for connecting opaque or semitransparent circuit boards with each other.

BACKGROUND OF THE INVENTION

As a method for connecting semiconductor chips to a circuit board such as an interposer, conventionally, wire-bonding connection and flip chip connection have been widely used. Recently, however, a method for mounting the semiconductor chips respectively on a plurality of interposers, and connecting these interposers with each other has been proposed, in order to increase the capacity of a memory.

In this case, not only the connection between the semiconductor chips and the interposer, but also the connection between the interposers is required. The method therefor includes a method of using a metal pin as described in Japanese Patent Laid Open No. 2002-76240, a method of using a bonding wire, and a method of using a solder.

The connection using the bonding wire can realize highly accurate connection, but on the other hand, operation time increases in proportion to the number of terminals, since it is necessary to connect the terminals to be connected one by one. Further, since the connection using the bonding wire is a planar connection, it is essentially difficult to decrease the size of the whole semiconductor device. Thus, when a plurality of interposers are connected to each other by using the bonding wire, there are problems in that the operation time is prolonged and the size of the whole semiconductor device increases.

On the other hand, the method of using the solder has an advantage in that the operation time is relatively short, but if coefficients of thermal expansion of the interposers differ largely from each other because of the copper distribution, misregistration occurs due to heating at the time of joining, and hence, it is difficult to apply this method to a semiconductor device having terminals with a narrow pitch. Further, the solder may remelt in a reflow process in which the stacked semiconductor device is mounted on a module board or a motherboard, and as a result, adjacent terminals may be short-circuited, thereby damaging reliability.

The above problems occur not only when a plurality of interposers having semiconductor chips mounted thereon are connected to each other, but also, for example, when a flexible sub-interposer having semiconductor chips mounted thereon is connected to a rigid main interposer.

On the other hand, since the connection using the bonding wire is a planar connection, even if the circuit boards such as the interposers are opaque or semitransparent, this does not cause a problem at the time of connection.

However, when the circuit boards such as the interposers are connected by superposition, if the circuit boards are opaque or semitransparent, visual recognition or image recognition of the terminals is not possible, or becomes very difficult, thereby causing a problem in that accurate connection becomes difficult. Such a problem does not occur when the terminals are protruded from the circuit board, but if the terminals are not protruded from the circuit board, and formed on the circuit board, it becomes a major problem.

SUMMARY OF THE INVENTION

The present invention has been achieved in order to solve the above problems. Therefore, it is an object of the present invention to provide a semiconductor device in which circuit boards such as interposers are connected with each other highly accurately, without using the bonding wire or the solder.

It is another object of the present invention to provide a manufacturing method of semiconductor devices, by which connection between circuit boards such as the interposers can be performed efficiently, highly accurately, and reliably.

It is still another object of the present invention to provide a connection method of circuit boards, by which terminals formed on the circuit boards can be accurately connected with each other, even when the circuit boards to be connected are opaque or semitransparent.

The above and other objects of the present invention can be accomplished by a semiconductor device, comprising: a first and a second interposers having internal terminals provided on one side thereof, respectively; and a first semiconductor chip arranged between the first and the second interposers, wherein a rear surface of the first semiconductor chip is fixed on said one side of the first interposer, a main surface of the first semiconductor chip is fixed on said one side of the second interposer, and the internal terminals provided on said one side of the first interposer and the internal terminals provided on said one side of the second interposer are joined with each other.

According to the present invention, since the first semiconductor chip is arranged between two interposers, and internal terminals provided on these interposers are joined together, it is not necessary to use the bonding wire or the solder. Joining of the internal terminals can be performed by ultrasonic waves, and positioning of the interposers can be performed by using positioning holes provided in the interposers.

The above and other objects of the present invention can also be accomplished by a semiconductor device, comprising: a plurality of sub-interposers having internal terminals provided on one side thereof, respectively; a plurality of semiconductor chips each electrically connected to the internal terminals on an associated one of the sub-interposers, and fixed on the one side of the associated one of the sub-interposers, respectively; and a main interposer having internal terminals provided on one side thereof, wherein the internal terminals on the main interposer are joined with the internal terminals on the plurality of sub-interposers.

In the present invention, since the internal terminals on the main interposer and on the sub-interposers are joined together, it is not necessary to use the bonding wire or the solder. Further, since a plurality of semiconductor chips are mounted on one main interposer, for example, when a memory is used as a semiconductor chip, it is possible to increase memory size considerably. Joining of the internal terminals in this case can be also performed by ultrasonic waves, and the positioning of the main interposer and the sub-interposers can be performed by using positioning holes respectively provided in the interposers.

One aspect of a manufacturing method of semiconductor devices according to the present invention, comprising: a first step of superposing a first interposer having first positioning units and a second interposer having second positioning units on each other, while positioning these interposers by using the first and the second positioning units; and a second step of ultrasonically joining first internal terminals provided on the first interposer with second internal terminals provided on the second interposer and connected to a semiconductor chip.

According to the present invention, since the interposers are positioned by using the first and the second positioning units, connection of interposers can be performed highly accurately. Since the internal terminals are ultrasonically joined, problems such as an increase of operation time in proportion to the number of terminals like connection using the bonding wire, misregistration due to heat like connection using the solder, and defective connection due to remelting do not occur. As a result, highly reliable connection can be realized efficiently.

It is preferable that the first and the second positioning units are first and second positioning holes provided in the first and the second interposers, respectively. In this case, the first step can be executed by inserting the positioning pins into the first and the second positioning holes. Consequently, highly accurate positioning can be realized by a simple method.

It is preferable that the second step is executed by pressing a side opposite to the second internal terminals as seen from the second interposer by an ultrasonic tool, and pressing by the ultrasonic tool is preferably performed simultaneously with respect to a plurality of internal terminals.

One aspect of a connection method of circuit boards according to the present invention, comprising: a first step of superposing a first opaque or semitransparent circuit board having first positioning units and internal terminals provided on one side thereof, on a second opaque or semitransparent circuit board having second positioning units and internal terminals provided on one side thereof, while positioning the first and the second circuit boards by using the first and the second positioning units, so that the one side of the first circuit board faces the one side of the second circuit board; and a second step of ultrasonically joining the internal terminals provided on the first circuit board with the internal terminals provided on the second circuit board, by pressing an ultrasonic tool from the other side of the second circuit board.

According to the present invention, ultrasonic joining is performed by pressing the ultrasonic tool from the other side of the second circuit board, while positioning the first and the second circuit boards by using the first and the second positioning units. As a result, even when both the first and the second circuit boards are opaque or semitransparent, connection between the circuit boards can be realized highly accurately.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
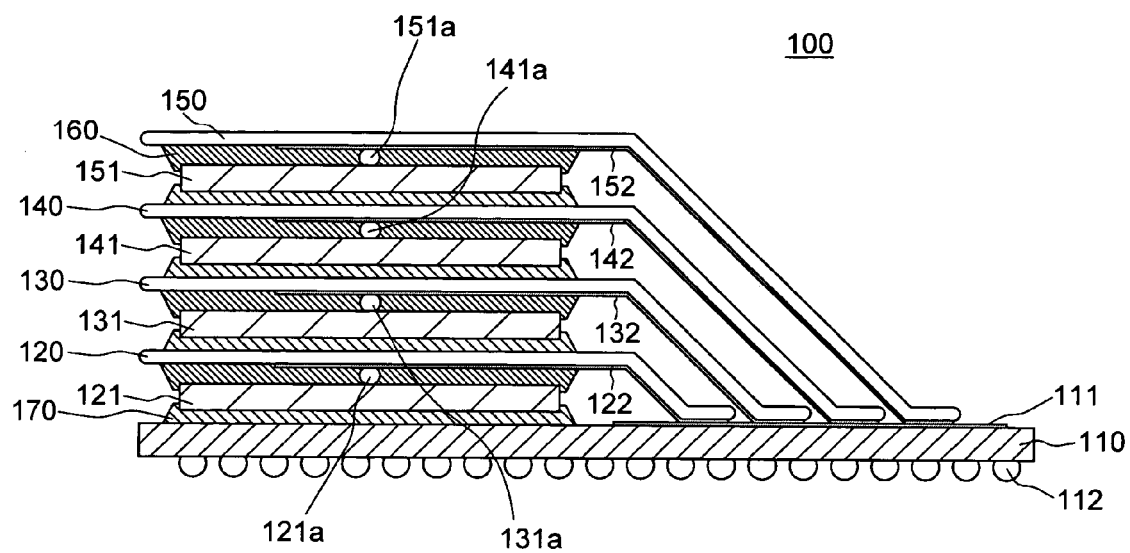
FIG. 1 is a schematic cross sectional view showing a semiconductor device according to a preferred embodiment of the present invention.

FIG. 1 is a schematic cross sectional view showing a semiconductor device 100 according to a preferred embodiment of the present invention.

As shown in FIG. 1, a semiconductor device 100 according to the present embodiment includes a main interposer 110, four sub-interposers 120, 130, 140, and 150 mounted on the main interposer 110, and semiconductor chips 121, 131, 141, and 151 respectively mounted on the sub-interposers 120, 130, 140, and 150. The main interposer 110 and the sub-interposers 120, 130, 140, and 150 are one type of a circuit board, and form a part of a package with respect to the semiconductor chips 121, 131, 141, and 151 in the embodiment. In FIG. 1, a mold covering the main interposer 110 is omitted, for easy understanding of the drawing.

A plurality of internal terminals 111 are provided on one side (an upper face in FIG. 1) of the main interposer 110, and a plurality of external terminals 112 connected to the internal terminals 111 are provided on the other side (a lower face in FIG. 1) thereof.

The internal terminals 111 are formed of metal such as gold (Au), tin (Sn), or copper (Cu). The external terminals 112 are used as electrodes at the time of mounting the semiconductor device 100 according to the embodiment on another module board, motherboard, or the like. In the embodiment, the main interposer 110 is rigid. On the other hand, the sub-interposers 120, 130, 140, and 150 are flexible, and a plurality of internal terminals 122, 132, 142, and 152 are respectively provided on one side (lower face in FIG. 1) of the sub-interposers.

The internal terminals 122, 132, 142, and 152 of the sub-interposers 120, 130, 140, and 150 are formed of metal such as gold (Au), tin (Sn), or copper (Cu) that can be joined with the internal terminals 111 of the main interposer 110.

The main surfaces (the upper faces in FIG. 1) of the semiconductor chips 121, 131, 141, and 151 are arranged so as to face to one side of the respectively corresponding sub-interposer 120, 130, 140, or 150. Accordingly, electrodes 121a, 131a, 141a, and 151a provided on the semiconductor chips 121, 131, 141, and 151 and the internal terminals 122, 132, 142, and 152 provided on the sub-interposers 120, 130, 140, and 150 are respectively electrically connected to each other.

The main surfaces of the semiconductor chips 121, 131, 141, and 151 are covered with an encapsulant 160. The semiconductor chips 121, 131, 141, and 151 are mechanically fixed on one side of the sub-interposers 120, 130, 140, and 150 by the encapsulant 160. The rear surfaces (the lower faces in FIG. 1) of the semiconductor chips 121, 131, 141, and 151 are mechanically fixed on the other side of another adjacent sub-interposer 120, 130, 140, or 150, or on one side of the main interposer 110 by an adhesive 170.

Figure 2:
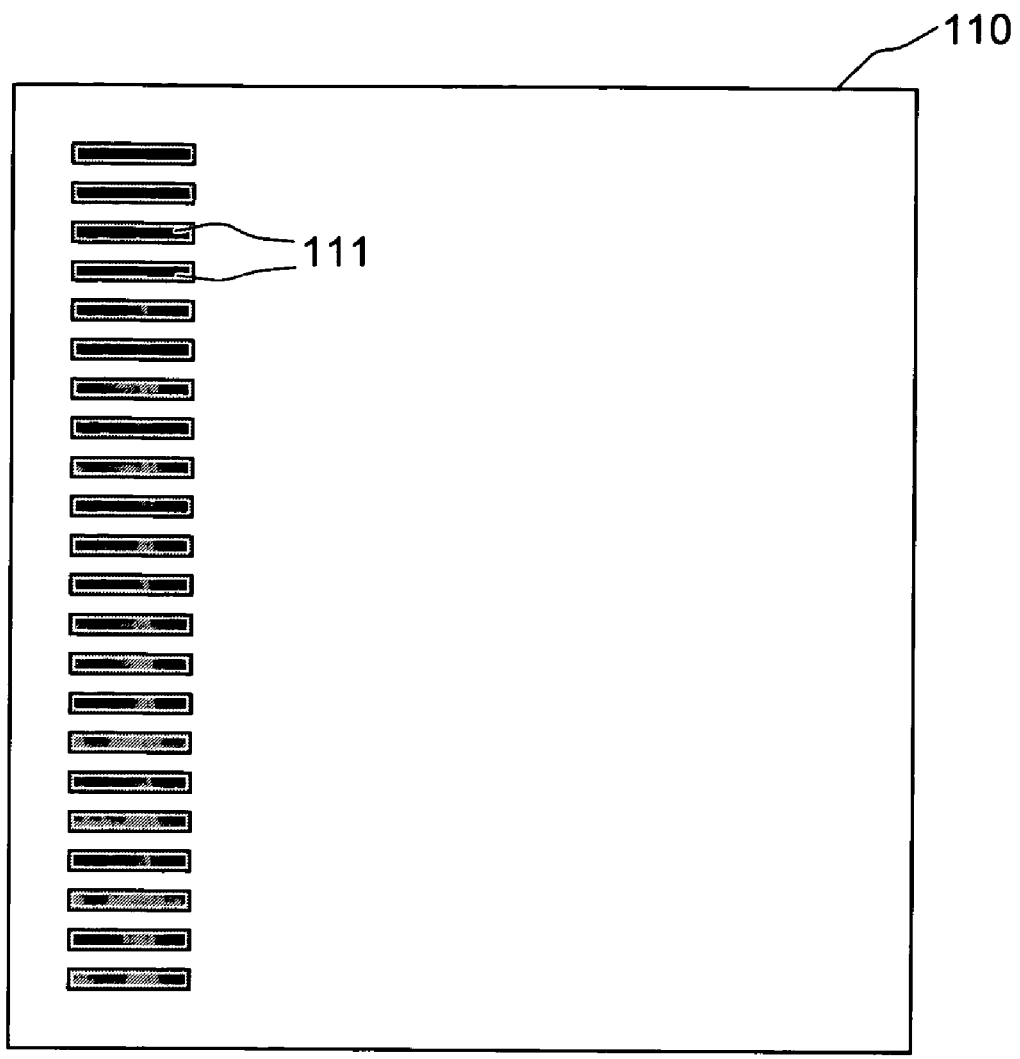
FIG. 2 is a top view of a main interposer as seen from the one side.

FIG. 2 is a top view of the main interposer 110 as seen from the one side.

As shown in FIG. 2, the internal terminals 111 provided on one side of the main interposer 110 are arranged in a row along one edge of the main interposer 110. Therefore, a pitch between the internal terminals 111 is considerably narrow as compared to a normal interposer that derives a terminal in two or four directions, and specifically, the pitch is made as narrow as 150 μm. In the embodiment, since the four sub-interposers 120 to 150 are mounted on one main interposer 110, the lengths of the respective internal terminals 111 respectively have a certain length so that the internal terminals 122, 132, 142, and 152 provided on the four sub-interposers 120 to 150 can be commonly connected.

Figure 3B:
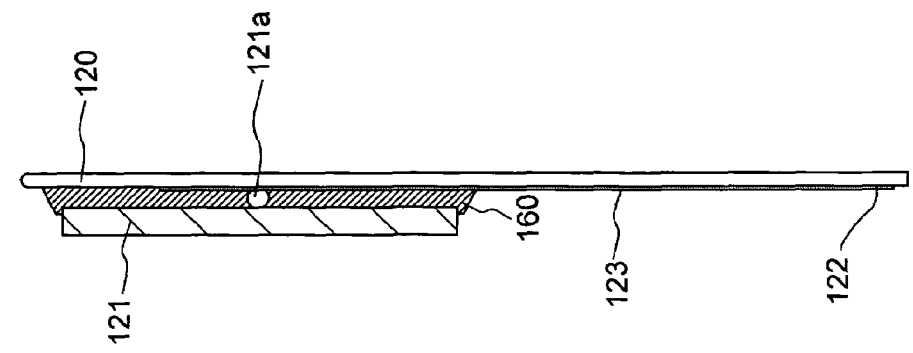
FIG. 3B is a side view of a sub-interposer.
Figure 3A:
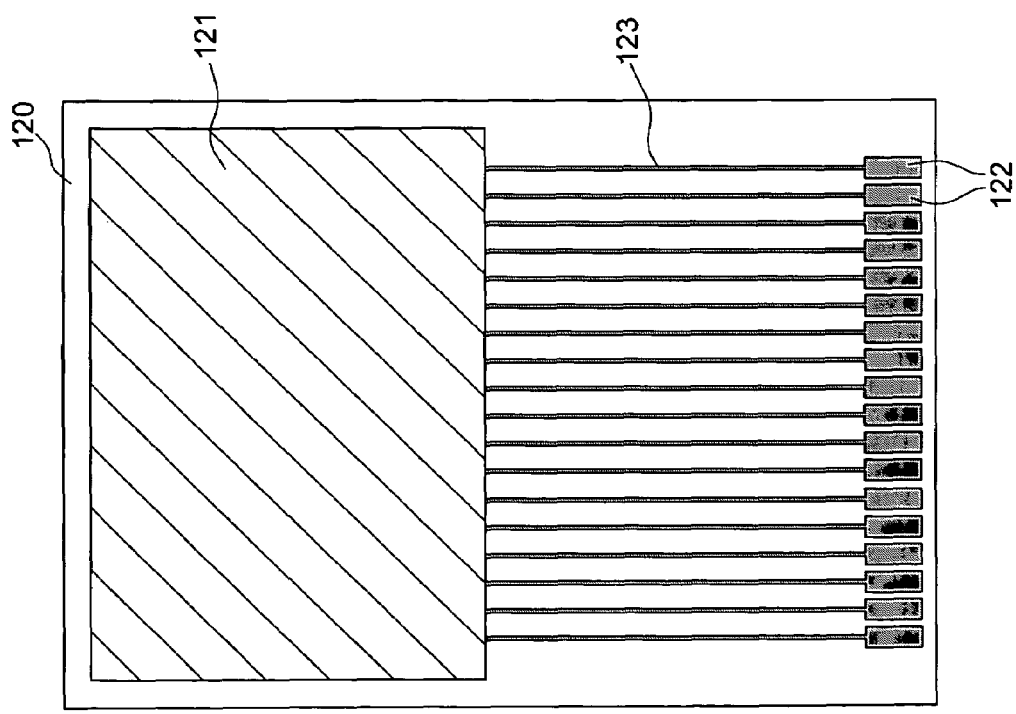
FIG. 3A is a top view of a sub-interposer.

FIG. 3A is a top view of a sub-interposer 120 and FIG. 3B is a side view of a sub-interposer 120.

As shown in FIGS. 3A and 3B, a plurality of wirings 123 laid in parallel are provided on one side of the sub-interposer 120, and one end of the wiring 123 is connected to the internal terminal 122, and other end is connected to the electrode 121a of the semiconductor chip 121. Therefore, the internal terminals 122 provided on the sub-interposer 120 are arranged, as shown in FIG. 3A, in a row along one edge of the sub-interposer 120.

Therefore, the pitch between the internal terminals 122 is considerably narrow as compared to the normal interposer that derives the terminal in two or four directions, and specifically, the pitch is made as narrow as 150 μm.

The other sub-interposers 130, 140, and 150 have the same structure as the sub-interposer 120 shown in FIG. 3.

In this configuration, the internal terminals 111 provided on one side of the main interposer 110 are joined with the internal terminals 122, 132, 142, and 152 provided on one side of the four sub-interposers 120, 130, 140, and 150 as shown in FIG. 1.

In other words, the internal terminals 111 and the internal terminals 122, 132, 142, and 152 are brought into direct contact with each other, without interposing the bonding wire or the solder. Ultrasonic waves are used as a method for connecting these internal terminals with each other. As a result, the respective internal terminals 111 provided on the main interposer 110 are commonly connected to the corresponding electrode 121a, 131a, 141a, or 151a of the four semiconductor chips 121, 131, 141, and 151.

The type of the semiconductor chips 121, 131, 141, and 151 mounted on the sub-interposers 120, 130, 140, and 150 are not particularly limited, but when the semiconductor chips are commonly connected on the main interposer 110 as in the embodiment, it is desired to use a semiconductor memory such as a DRAM (Dynamic Random Access Memory).

If the semiconductor memory is respectively mounted on the four sub-interposers 120, 130, 140, and 150, and the corresponding terminals are commonly connected with each other on the main interposer 110, an address space four times as large as the address space when one semiconductor memory is used can be obtained. In this case, however, chip selection terminals (CS) are not commonly connected, and separate wiring is required for the chip selection terminals on the main interposer 110, so that a chip selection signal different for each semiconductor memory can be supplied.

A manufacturing method of the semiconductor device 100 according to the present embodiment is explained below.

Figure 4:
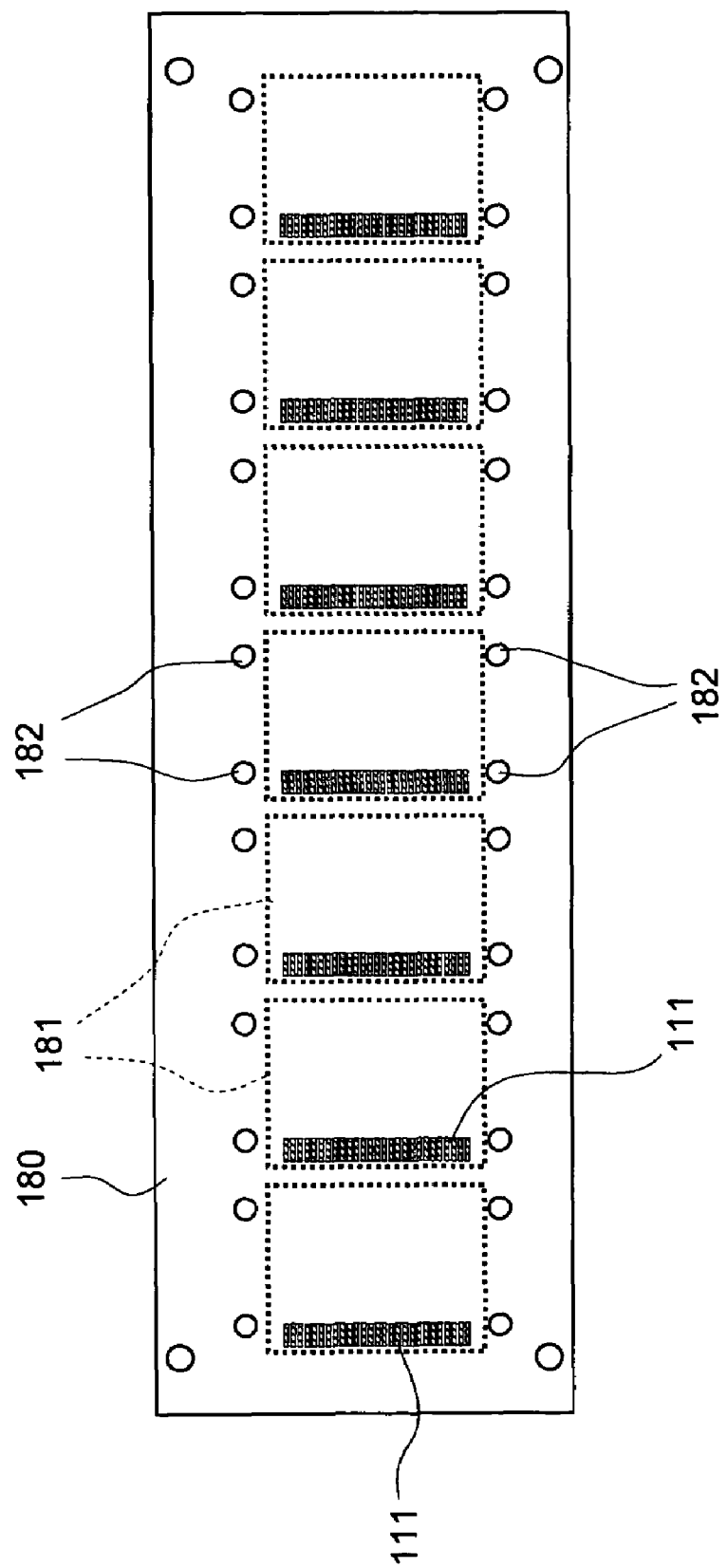
FIG. 4 is a plan view of a substrate, on which multiple main interposers can be arranged.
Figure 5:
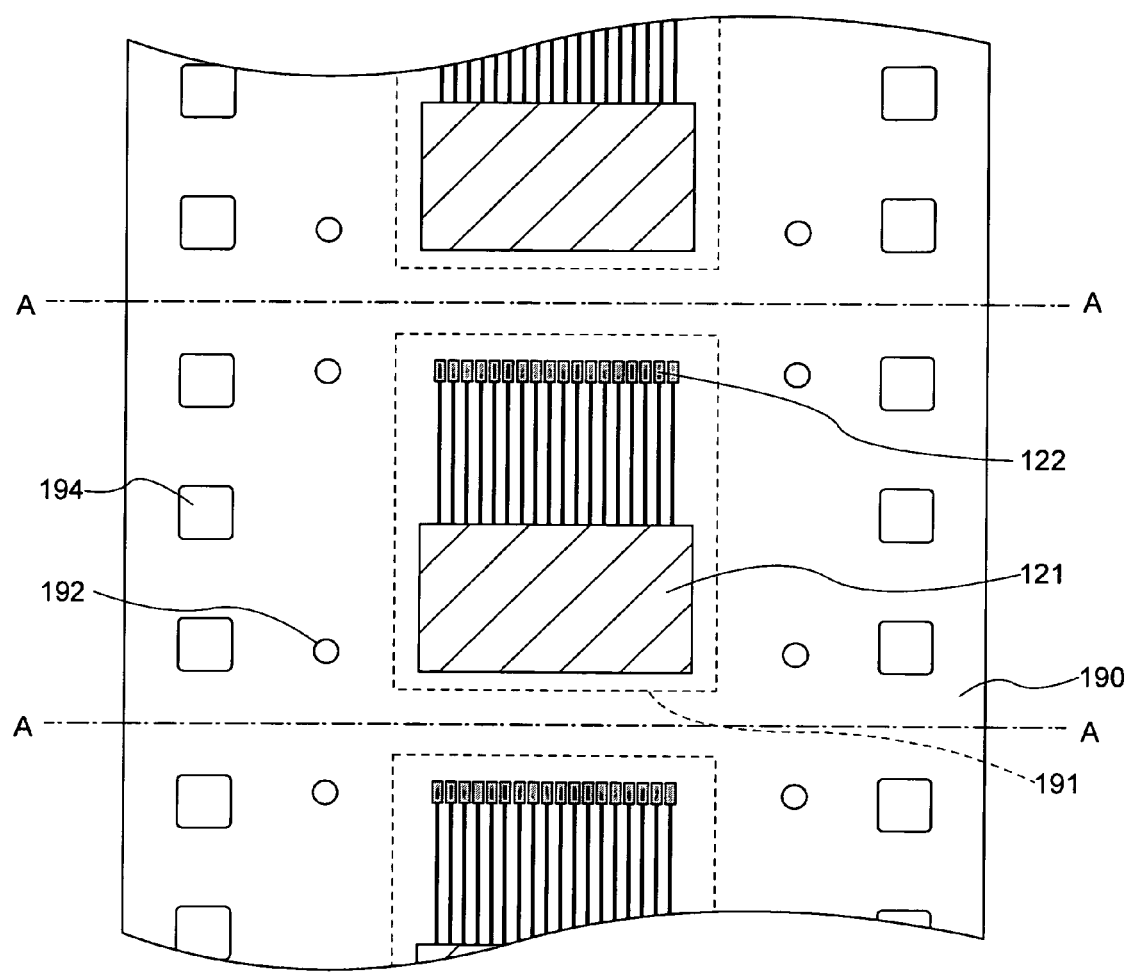
FIG. 5 is an enlarged partial plan view of a flexible tape, on which multiple sub-interposers can be arranged.

A substrate 180, which becomes the main interposers 110 shown in FIG. 4, and a flexible tape 190, which becomes the sub-interposers 120, 130, 140, and 150 shown in FIG. 5, are prepared. The substrate 180, which becomes the main interposer 110, can arrange multiple main interposers 110 thereon, and a plurality of internal terminals 111 are respectively provided, as shown in FIG. 4, in an area 181, which becomes the main interposer 110.

Four positioning holes 182 are respectively provided corresponding to each area 181, outside of the area 181 to become the main interposer 110. A relative position of the positioning hole 182 and the internal terminal 111 provided in the corresponding area 181 is strictly defined. A material of the substrate 180 is not particularly limited, and an opaque or semitransparent material can be used. In the present invention, the substrate 180 before being cut may be referred to as an "interposer".

On the other hand, the flexible tape 190, which becomes the sub-interposers 120, 130, 140, and 150, can arrange the multiple sub-interposers 120, 130, 140, and 150 thereon, and as described later, the lengths of the terminal positions of the internal terminals 122, 132, 142, and 152 are adjusted to a necessary length before the sub-interposers are laminated and mounted.

As shown in FIG. 5, the internal terminal 122 (or 132, 142, 152) is formed in an area 191, which becomes the sub-interposer 120, 130, 140, or 150, respectively, and the semiconductor chip 121 (or 131, 141, 151) connected to the internal terminal 122 (or 132, 142, 152) is mounted. As explained with reference to FIGS. 1 and 3, the main surface of the semiconductor chip 121 (or 131, 141, 151) is encapsulated by the encapsulant 160. Accordingly, the main surface of the semiconductor chip 121 (or 131, 141, 151) is mechanically fixed on the flexible tape 190. In the present invention, the flexible tape 190 before being cut may be referred to as an "interposer".

In the flexible tape 190, four positioning holes 192 corresponding to each area 191 are provided outside of the area 191 to become the sub-interposers 120, 130, 140, and 150. A relative position of the positioning holes 192 and the internal terminal 122 (or 132, 142, 152) provided in the corresponding area 191 is strictly defined.

Perforations 194 are provided on both sides along the longitudinal direction of the flexible tape 190. Formation of the internal terminal 122 (or 132, 142, 152) or mounting of the semiconductor chip 121 (or 131, 141, 151) can be performed by feeding out the flexible tape 190 in the longitudinal direction by using the perforations 194.

The material of the flexible tape 190 is not particularly limited, and an opaque or semitransparent material can be used. As shown in FIG. 1, when the planar positions of the respective semiconductor chips 121, 131, 141, and 151 as seen from the laminated direction agree with each other, the necessary lengths of the wirings 123 (see FIG. 3A) are different from each other. That is, the necessary length of the wiring 123 arranged on the bottom sub-interposer is the shortest, and that of the wiring 123 arranged on the top sub-interposer is the longest.

Taking this point into consideration, different flexible tapes 190, with the length of the wiring 123 being optimized, can be used for each of the sub-interposers 120, 130, 140, and 150. However, as shown in FIG. 6, the terminal positions of the internal terminals 122, 132, 142, and 152 may be optimized by taking out the sub-interposers 120, 130, 140, and 150 from a common flexible tape 190, and cutting the sub-interposers 120, 130, 140, and 150 in different lengths.

Figure 6:
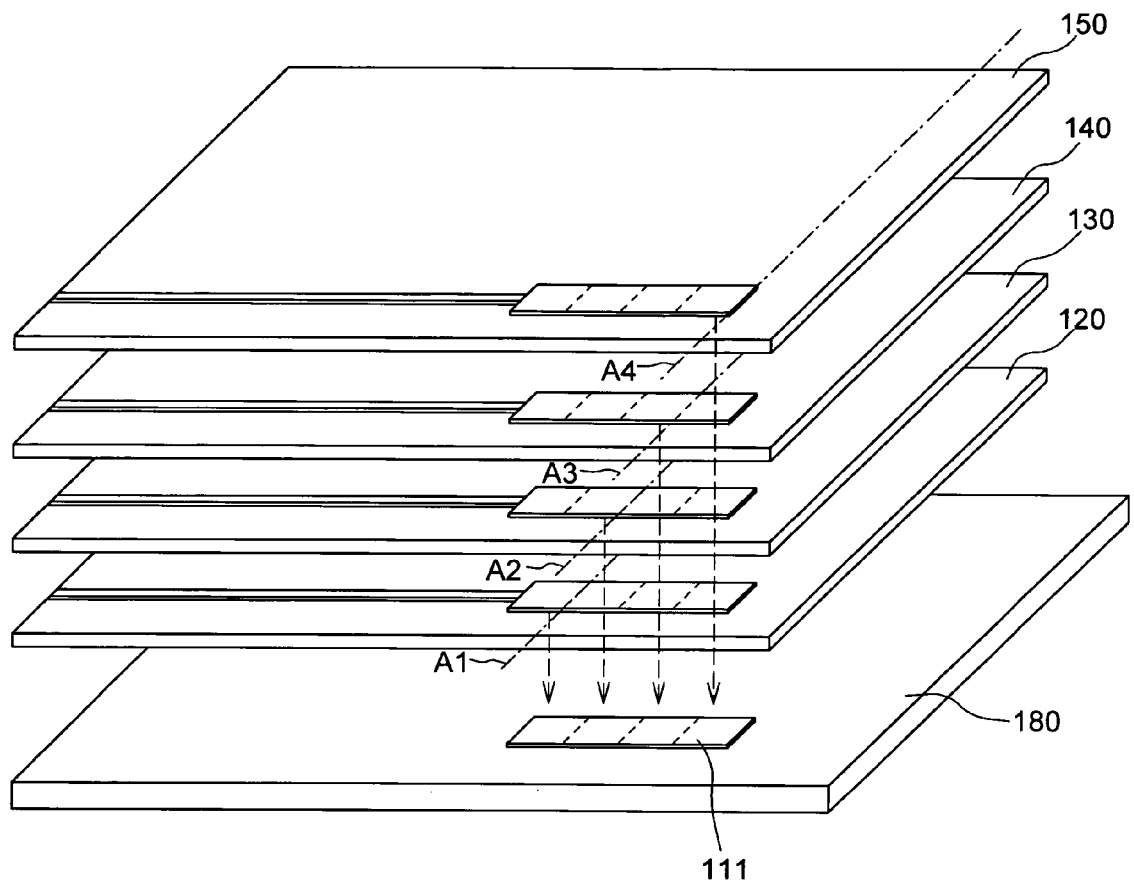
FIG. 6 is an explanatory diagram of a method for optimizing terminal positions of internal terminals for each sub-interposer.

That is, as shown in FIG. 6, the lengths of the internal terminals 122, 132, 142, and 152 are set to be long to some extent, and at the time of cutting the flexible tape 190 along line A-A as shown in FIG. 5, the sub-interposer 120 arranged at the bottom layer is cut along line A1, and the sub-interposers 130, 140, and 150 arranged in the upper layers are respectively cut along line A2, A3, and A4 as shown in FIG. 6, thereby enabling optimization of the terminal positions of the internal terminals 122, 132, 142, and 152 for each of the sub-interposers 120, 130, 140, and 150.

Figure 7:
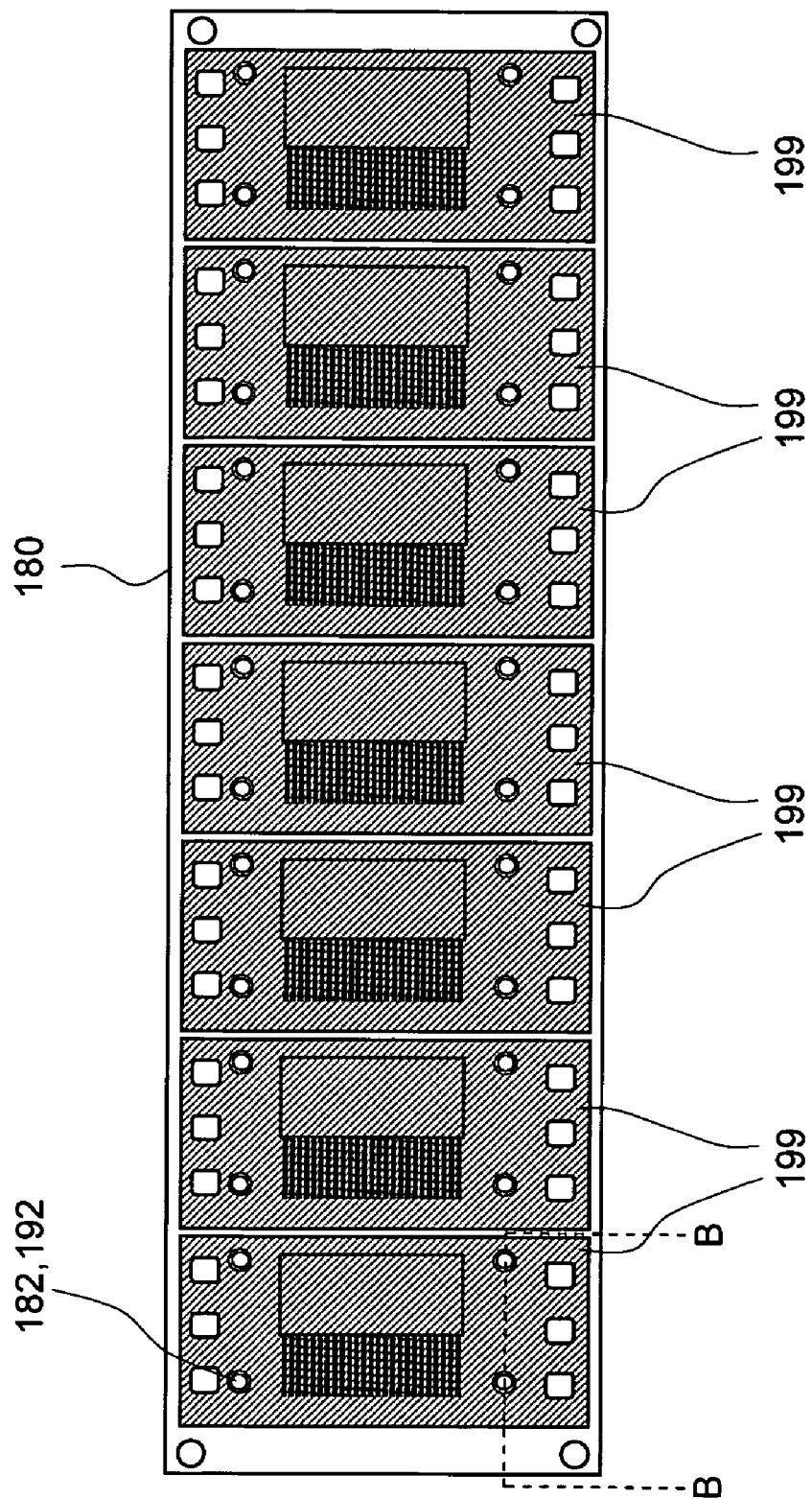
FIG. 7 is a plan view showing a state in which a plurality of cut pieces of the flexible tape are positioned and superposed on the substrate.

As shown in FIG. 7, the cut piece 199 of the flexible tape 190 is respectively overlapped on each area 181 on the substrate 180, in the state with the adhesive 170 being applied to each area 181 on the substrate 180. At this time, positioning of the substrate 180 and the cut pieces 199 is performed by using the positioning holes 182 and the positioning holes 192.

Figure 8:
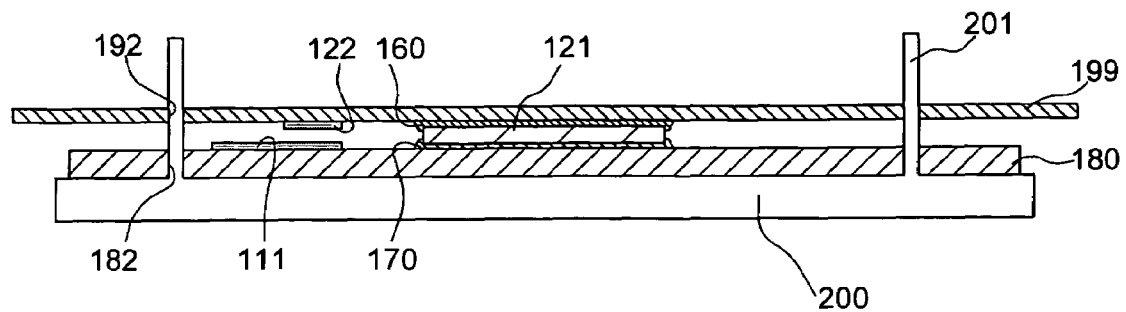
FIG. 8 is a cross sectional view along the B-B line shown in FIG. 7.

That is, as shown in FIG. 8, being a cross section along line B-B in FIG. 7, the substrate 180 and the cut pieces 199 are positioned by inserting positioning pins 201 provided on a jig 200 into the positioning holes 182 in the substrate 180 and the positioning holes 192 in the flexible tape 190. The diameter of the positioning pin 201 is substantially the same as that of the positioning holes 182 and 192 or slightly smaller.

Therefore, when the positioning pin 201 is inserted into the positioning holes 182 and 192, the movement of the substrate 180 and the cut pieces 199 of the flexible tape 190 in the planar direction on the jig 200 is prevented, and hence, the substrate 180 and the cut piece 199 of the flexible 190 are fixed in planar.

As described above, the relative position of the positioning holes 182 and the internal terminals 111 is strictly defined, and the relative position of the positioning holes 192 and the internal terminals 122 is strictly defined. Accordingly, if it is designed so that the relative position of the positioning holes 182 and the internal terminals 111 agrees with the relative position of the positioning holes 192 and the internal terminals 122, the internal terminals 111 provided on the substrate 180 can be accurately made to face the internal terminals 122 provided on the flexible tape 190, by inserting the common positioning pin 201 respectively into these positioning holes 182 and 192.

As a result, since the substrate 180 or the flexible tape 190 is opaque or semitransparent, even when positioning by visual recognition or image recognition is not possible or difficult, the internal terminals 111 and 122 can be registered correctly.

Accordingly, the substrate 180 and the cut pieces 199 of the flexible tape 190 are bonded by the adhesive 170 in the correctly positioned state.

Figure 9:
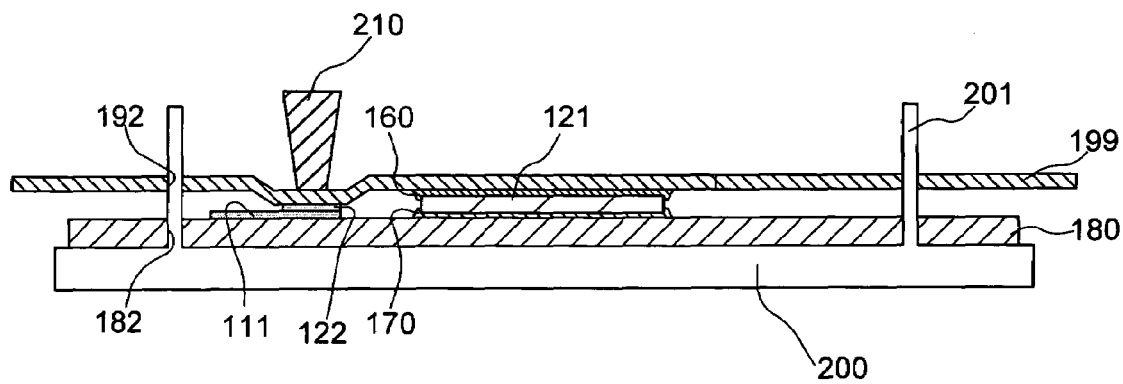
FIG. 9 is a cross sectional view for explaining a method for connecting the internal terminals with each other by using an ultrasonic tool.

As shown in FIG. 9, the rear side of the cut piece 199, that is, a face opposite to a face, on which the internal terminals 122 are formed, is pressed by an ultrasonic tool 210, thereby enabling ultrasonic joining of the internal terminals 111 provided on the substrate 180 with the internal terminals 122 provided on the flexible tape 190, respectively.

Figure 10:
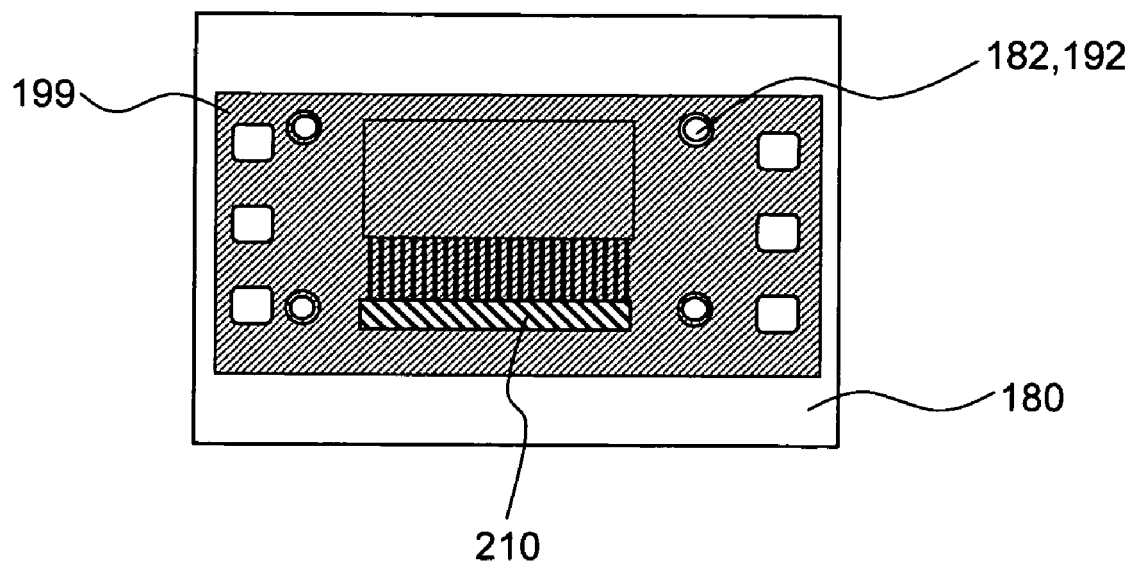
FIG. 10 is a plan view for explaining a method for connecting the internal terminals with each other collectively by using the ultrasonic tool.

As shown in FIG. 10, being a schematic plan view, it is desired to use a tool having a width wider than that of an array of the internal terminals 111 and 122 as the ultrasonic tool 210 to be used. Consequently, the internal terminals 111 and 122 arranged in a row can be ultrasonically joined collectively.

Figure 11:
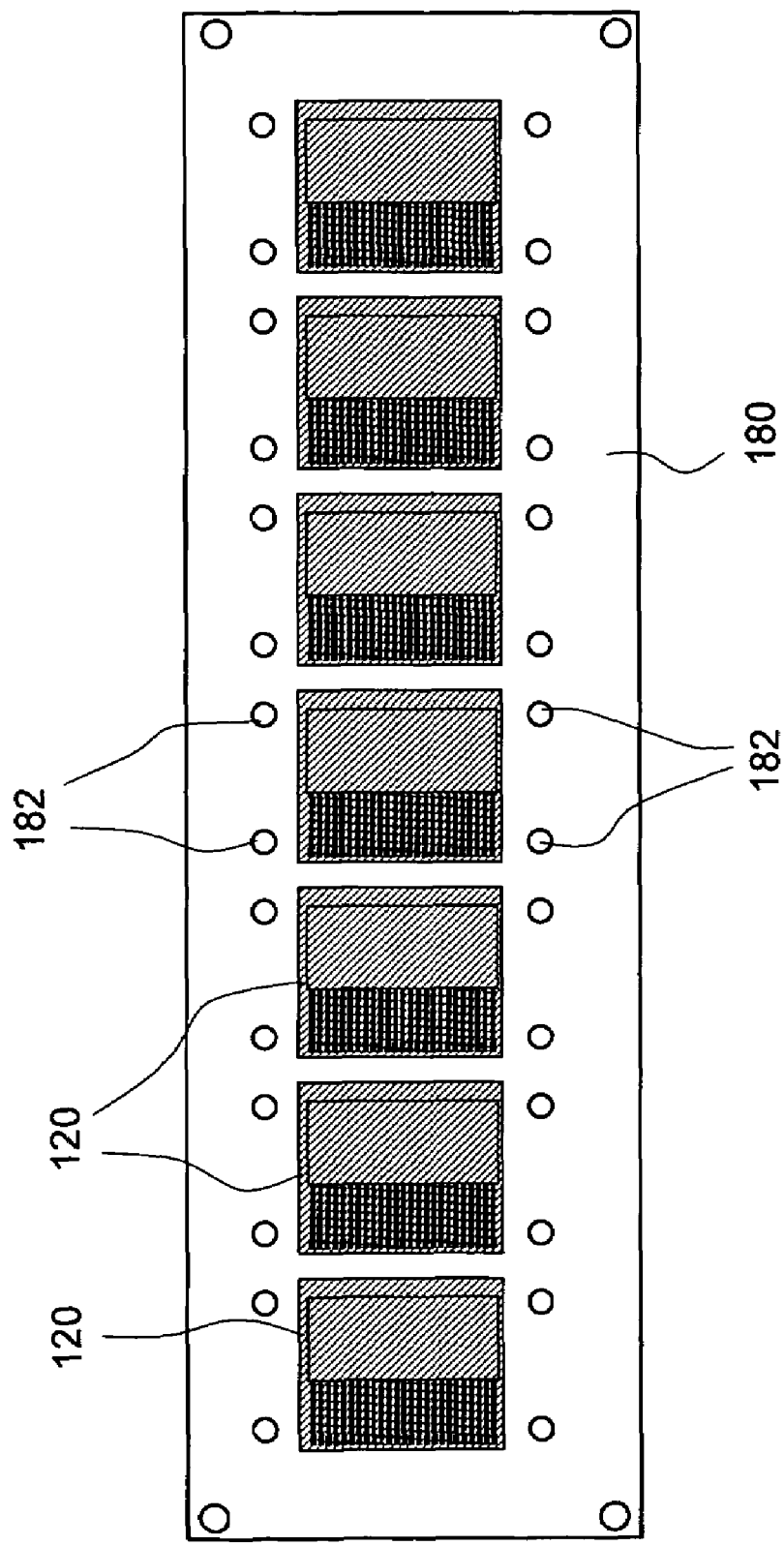
FIG. 11 is a plan view showing a state in which the sub-interposers are connected on the substrate.

When the flexible tape 190 (the cut piece 199) is cut and an unnecessary part is removed, as shown in FIG. 11, the substrate 180 and the sub-interposers 120 are electrically connected and mechanically fixed. Subsequently, the processes shown in FIGS. 7 to 11 are repeated, thereby sequentially laminating the sub-interposers 130, 140, and 150 on the substrate 180. In this case, the positioning and the ultrasonic joining of the flexible tape 190 may not be repeated for each of the sub-interposers 120, 130, 140, and 150, and all the cut pieces 199 to be the sub-interposers 120, 130, 140, and 150 may be positioned, and then ultrasonically joined collectively.

After joining of the substrate 180 with the sub-interposers 120, 130, 140, and 150 has been completed, an area 181, which is to be the main interposer 110, is individually molded, or a plurality of areas 181 are molded collectively, and the substrate 180 is cut along the area 181, thereby completing the semiconductor device 100 according to the embodiment.

As described above, in the manufacturing method of the semiconductor device according to the embodiment, since the substrate 180 to be the main interposer 110 and the flexible tape 190 (cut pieces 199) to be the sub-interposers 120, 130, 140, and 150 are positioned by inserting the positioning pins 201 into the positioning holes 182 and 192, even when the substrate 180 and the flexible tape 190 are opaque or semi-transparent, the internal terminals 111 and the internal terminals 122, 132, 142, and 152 arranged in a narrow pitch can be accurately positioned.

Further, since joining of the internal terminals 111 with the internal terminals 122, 132, 142, and 152 is performed by ultrasonic joining, these terminals can be directly joined, and hence, it is not necessary to use the solder, which may cause a defect at the time of reflow, or the bonding wire, which increases the size.

Further, joining can be performed approximately at a room temperature, and since a high temperature is not applied, even when there is a large difference in coefficients of thermal expansion between materials of the substrate 180 and the flexible tape 190, defective joining hardly occurs resulting from the difference.

Further, as shown in FIG. 10, if ultrasonic joining is performed collectively with respect to the internal terminals 111 and 122 (or 132, 142, 152) arranged in a row, joining operation can be completed within a short period of time, regardless of the number of terminals.

The present invention is in no way limited to the aforementioned embodiments, but rather various modifications are possible within the scope of the invention as recited in the claims, and naturally these modifications are included within the scope of the invention.

Figure 12:
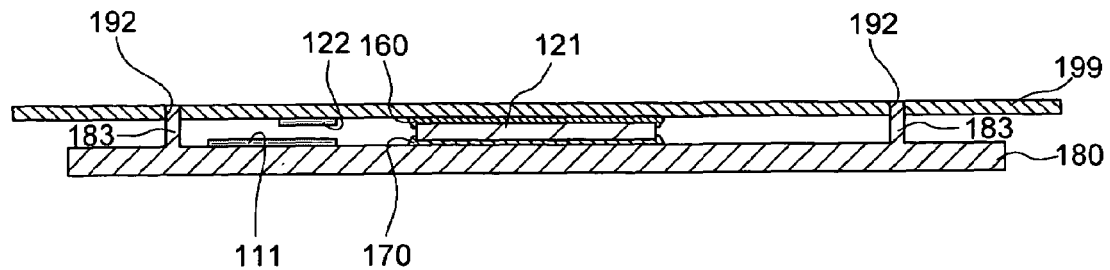
FIG. 12 is a cross sectional view for explaining a positioning method according to a modified example of the present invention.

For example, in the embodiment, the positioning is performed by inserting the positioning pins 201 into the positioning holes 182 and 192. However, the positioning method is not limited thereto, and as shown in FIG. 12, positioning can be performed by protrusions 183 on the substrate 180, and inserting the protrusions 183 into the positioning holes 192 in the flexible tape 190 (the cut piece 199).

Figure 13:
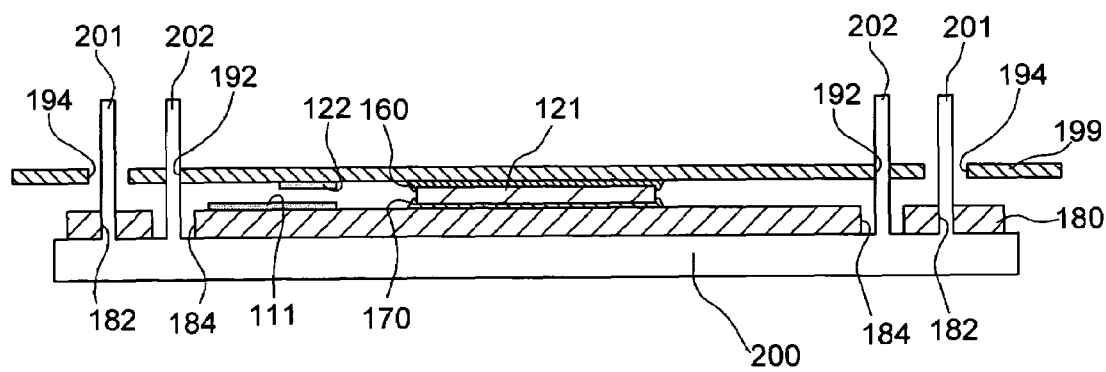
FIG. 13 is a cross sectional view for explaining a positioning method according to another modified example of the present invention.

In the case where the positioning holes 182 and 192 are used, it is not essential to insert the common positioning pins 201 into the positioning holes 182 and 192, and as shown in FIG. 13, the substrate 180 and the flexible tape 190 may be positioned by inserting the positioning pins 201 into the positioning holes 182 in the substrate 180, and inserting another positioning pin 202 into the positioning hole 192 in the flexible tape 190 (the cut piece 199).

In this case, a hole 184 for avoiding interference with the positioning pin 202 is provided in the substrate 180, and a hole 194 for avoiding interference with the positioning pin 201 is provided in the flexible tape 190 (the cut piece 199). Since these holes 184 and 194 are for simply avoiding the interference, these holes 184 and 194 can have a sufficiently large diameter than that of the positioning pins 201 and 202, and need not be positioned strictly with respect to the internal terminals 111 and 122.

The number of positioning holes need not be four with respect to one area 181, which is to be the main interposer 110, or one area 191, which is to be the sub-interposer 120, 130, 140, or 150, and two or more positioning holes can be allocated to each area.

Figure 14:
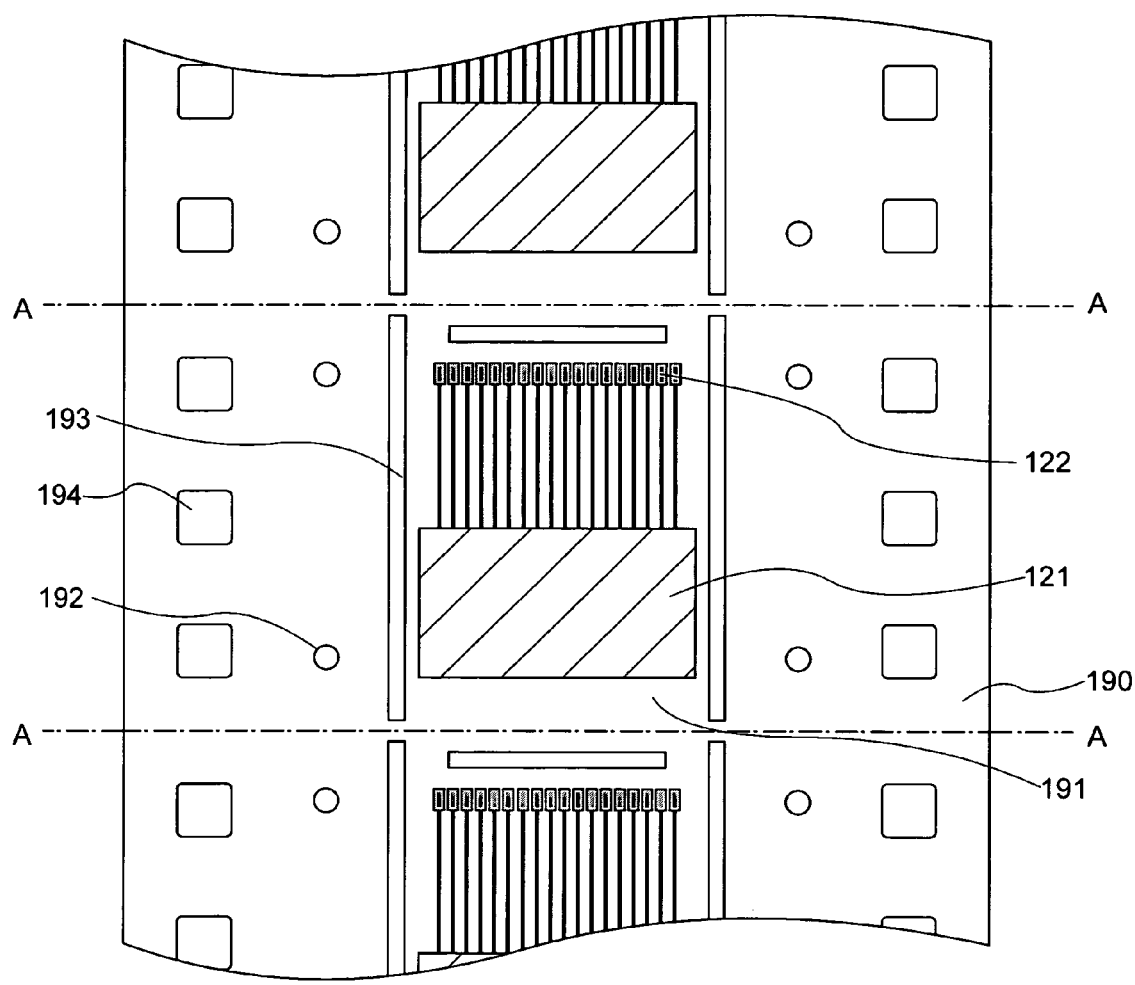
FIG. 14 is an enlarged partial plan view of a flexible tape which has slits.

Slits 193 may be preformed in the flexible tape 190, as shown in FIG. 14, in order to facilitate cutting of the flexible tape 190 (the cut pieces 199) in the process shown in FIG. 11, and cutting may be performed along the slits 193 in the process shown in FIG. 11.

Further, the method according to the present invention can be applied not only to packaging of the semiconductor chip, but also to a case in which a circuit board such as a camera module formed of a flexible or rigid board is connected to a rigid or flexible circuit board such as a motherboard.

Figure 15:
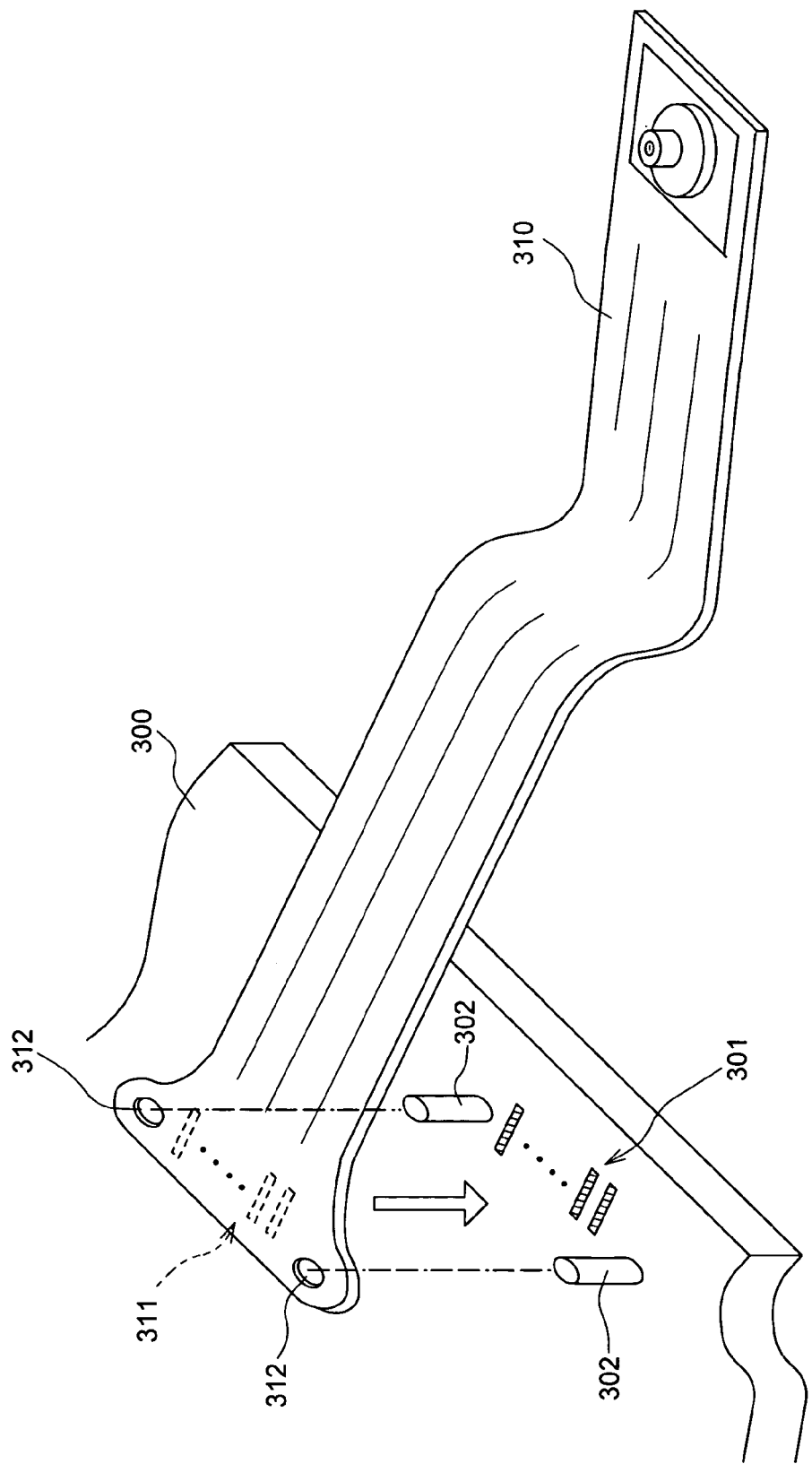
FIG. 15 is a schematic perspective view for explaining an example in which the method according to the present invention is applied to connection of a motherboard with a camera module.

For example, as shown in FIG. 15, when a plurality of terminals 301 provided in a boundary region of an opaque or semitransparent motherboard 300 are connected to a plurality of terminals 311 provided in an opaque or semitransparent camera module 310, positioning is performed by inserting protrusions 302 provided on the rigid motherboard 300 into the positioning holes 312 provided in the camera module 310, and the terminals 301 and 311 can be ultrasonically joined by pressing an ultrasonic tool in this state from a rear side (a side opposite to a side where the terminals 311 are formed) of the flexible camera module 310.

In the example shown in FIG. 15, positioning is performed by inserting the protrusions 302 provided on the motherboard 300 into the positioning holes 312 provided in the camera module 310. However, the positioning method is not limited thereto, and for example, positioning holes may be provided both in the motherboard 300 and the camera module 310, as in the above embodiment, and positioning may be performed by inserting the positioning pins into the positioning holes. Further, the circuit boards to be connected are not limited to the motherboard and the camera module, and the positioning method can be applied to a connection between other circuit boards.

According to the present invention, circuit boards such as interposer or substrate can be connected highly accurately, without using the bonding wire or the solder. Since the bonding wire is not used for connection, even when the number of terminals is large, and efficient operation can be performed without increasing the operation time. Further, since the solder is not used for the connection, not only misregistration does not occur resulting from a difference in coefficients of thermal expansion of both boards, but also defective connection due to remelting does not occur. As a result, reliable connection can be realized efficiently.

Further, according to the present invention, even when the circuit boards to be connected are opaque or semitransparent, terminals formed on the circuit boards can be accurately connected.

What is claimed is:

1. A semiconductor device, comprising:
   a first and a second interposers having internal terminals provided on one side thereof, respectively;
   a first semiconductor chip arranged between the first and the second interposers, wherein
   a rear surface of the first semiconductor chip is fixed on said one side of the first interposer,
   a main surface of the first semiconductor chip is fixed on said one side of the second interposer,
   the internal terminals provided on said one side of the second interposer have a length extending from said first semiconductor chip to said first interposer, and
   the internal terminals provided on said one side of the first interposer and the internal terminals provided on said one side of the second interposer are in direct physical contact with each other; and
   the second interposer has a length which extends to cover the first semiconductor chip and the length of the internal terminals provided on said one side of the second interposer extending from said first semiconductor chip to said first interposer.

2. The semiconductor device as claimed in claim 1, wherein said first interposer is rigid, and said second interposer is flexible.

3. The semiconductor device as claimed in claim 2, wherein external terminals are provided on the other side of the first interposer.

4. The semiconductor device as claimed in claim 1, wherein the first and the second interposers are respectively opaque or semitransparent.

5. The semiconductor device as claimed in claim 1, wherein the internal terminals provided on the first and the second interposers are respectively arranged in a row along one edge of the first and the second interposers.

6. The semiconductor device as claimed in claim 1, wherein the first semiconductor chip and the first interposer are fixed together by an adhesive, and the first semiconductor chip and the second interposer are fixed together by an encapsulant.

7. The semiconductor device as claimed in claim 1, further comprising a third interposer having internal terminals provided on one side thereof, and a second semiconductor chip arranged between the second and the third interposers, wherein
   a rear surface of the second semiconductor chip is fixed on the other side of the second interposer,
   a main surface of the second semiconductor chip is fixed on the one side of the third interposer, and
   the internal terminals provided on the one side of the first interposer and the internal terminals provided on the one side of the third interposer are joined with each other.

8. The semiconductor device as in claim 7, wherein
   the internal terminals provided on the one side of the first interposer and the internal terminals provided on the one side of the third interposer are in direct physical contact with each other, and
   the third interposer has a length which extends to cover the second semiconductor chip and the length of the internal terminals provided on said one side of the third interposer extending from said second semiconductor chip to said first interposer.

9. A semiconductor device, comprising:

a plurality of sub-interposers having internal terminals provided on one side thereof, respectively;

a plurality of semiconductor chips each electrically connected to the internal terminals on an associated one of the sub-interposers, and fixed on the one side of the associated one of the sub-interposers, respectively;

a main interposer having internal terminals provided on one side thereof, wherein the internal terminals provided on said one side of the plurality of sub-interposers have lengths extending from respective semiconductor chips to said main interposer, the internal terminals on the main interposer are in direct physical contact with the internal terminals on the plurality of sub-interposers, and the sub-interposers each have a length which extends to cover the respective semiconductor chips and the lengths of the internal terminals provided on said one side of the respective plurality of interposers extending from said respective semiconductor chips to said main interposer.

10. The semiconductor device as claimed in claim 9, wherein the plurality of sub-interposers are laminated on the one side of the main interposer.

11. The semiconductor device as claimed in claim 9, wherein at least a part of the internal terminals on the main interposer are commonly connected to the corresponding internal terminals provided on the plurality of sub-interposers.

12. The semiconductor device as claimed in claim 9, wherein the internal terminals provided on the main interposer and on the sub-interposer are respectively arranged in a row along one edge of the main interposer and the sub-interposer.

* * * * *